US012796266B2

(12) United States Patent
Lee et al.

(10) Patent No.: US 12,796,266 B2
(45) Date of Patent: Nov. 10, 2026

(54) ORGANIC LIGHT EMITTING DISPLAY APPARATUS HAVING A METAL MIRROR PATTERN AND A CAMERA

(71) Applicant: Samsung Display Co., Ltd., Yongin-Si (KR)

(72) Inventors: Daewoo Lee, Hwaseong-si (KR); Shinmoon Kang, Seoul (KR); Byung Ik Kong, Gimhae-si (KR); Byoungki Kim, Seoul (KR); Hyunchul Son, Asan-si (KR); Yun-Mo Chung, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 206 days.

(21) Appl. No.: 16/779,375

(22) Filed: Jan. 31, 2020

(65) Prior Publication Data

US 2020/0176716 A1 Jun. 4, 2020

Related U.S. Application Data

(63) Continuation of application No. 15/440,868, filed on Feb. 23, 2017, now abandoned.

(30) Foreign Application Priority Data

Mar. 4, 2016 (KR) ........................ 10-2016-0026625

(51) Int. Cl.
*H10K 59/80* (2023.01)
*H10K 59/35* (2023.01)

(52) U.S. Cl.
CPC ......... *H10K 59/352* (2023.02); *H10K 59/353* (2023.02); *H10K 59/871* (2023.02); *H10K 59/878* (2023.02)

(58) Field of Classification Search
None
See application file for complete search history.

(56) References Cited

U.S. PATENT DOCUMENTS 5,585,817 A 12/1996 Itoh et al.
6,454,414 B1 9/2002 Ting
(Continued)

FOREIGN PATENT DOCUMENTS

CN 1819727 A 8/2006
CN 101800233 A 8/2010
(Continued)

OTHER PUBLICATIONS

Korean Intellectual Property Office NOA to Korean Patent Application No. 10-2016-0026625, dated on Dec. 27, 2022, 7 pages.

*Primary Examiner* — Anh D Mai
(74) *Attorney, Agent, or Firm* — Innovation Counsel LLP

(57) ABSTRACT

An organic light emitting display apparatus includes first to eighth pixels arranged in a 4*2 matrix form along first and second directions, and includes a camera which is configured to take a picture. Each of the first to eighth pixels has a width in the first direction and has a length in the second direction. Each of the first to eighth pixels has a light emitting structure and a first mirror pattern which defines an opening which overlaps the light emitting structure. The first mirror pattern defines one transmission window in every two or more pixels adjacent each other, the transmission window passes light, and the camera is configured to take a picture through the transmission window.

7 Claims, 11 Drawing Sheets

(56) References Cited

U.S. PATENT DOCUMENTS

| | | | |
|---|---|---|---|
| 7,579,775 | B2 | 8/2009 | Song et al. |
| 8,952,998 | B2 | 2/2015 | Gu et al. |
| 9,093,669 | B2 | 7/2015 | Park et al. |
| 9,300,909 | B2 | 3/2016 | Nakamura |
| 9,356,054 | B2 | 5/2016 | Miyairi et al. |
| 9,490,311 | B2 | 11/2016 | Park et al. |
| 9,647,025 | B2 | 5/2017 | Watanabe et al. |
| 10,276,640 | B2 * | 4/2019 | Chung .................. G06F 1/1605 |
| 10,551,662 | B2 | 2/2020 | Kimura et al. |
| 2007/0291325 | A1 | 12/2007 | Toyota et al. |
| 2008/0165267 | A1 * | 7/2008 | Cok ........................ H04N 7/144 348/E5.022 |
| 2011/0102308 | A1 * | 5/2011 | Nakamura .......... H01L 27/3234 345/84 |
| 2011/0169720 | A1 * | 7/2011 | Hwang ................ H10K 59/121 345/76 |
| 2011/0175097 | A1 * | 7/2011 | Song .................... H10K 59/121 257/59 |
| 2011/0220901 | A1 | 9/2011 | Ha et al. |
| 2011/0298953 | A1 | 12/2011 | Nakamura |
| 2014/0048781 | A1 * | 2/2014 | Chang ................... C23C 14/042 257/40 |
| 2014/0160411 | A1 | 6/2014 | Yim et al. |
| 2014/0312321 | A1 | 10/2014 | Yoo et al. |
| 2014/0353598 | A1 * | 12/2014 | Jeong ....................... H01L 51/56 257/40 |
| 2015/0048347 | A1 | 2/2015 | Tokuda et al. |
| 2016/0240818 | A1 * | 8/2016 | Chung ................... H10K 50/86 |
| 2016/0293687 | A1 * | 10/2016 | Chang ................... H01L 27/326 |
| 2017/0070679 | A1 | 3/2017 | Chung et al. |
| 2017/0214003 | A1 | 7/2017 | Lee et al. |
| 2017/0277219 | A1 | 9/2017 | Chung et al. |

FOREIGN PATENT DOCUMENTS

| | | | |
|---|---|---|---|
| CN | 102271219 | A | 12/2011 |
| KR | 10-2004-0110834 | A | 12/2004 |
| KR | 10-2009-0126141 | A | 12/2009 |
| KR | 10-2010-0088680 | A | 8/2010 |
| KR | 10-2012-0052206 | A | 5/2012 |
| KR | 10-2013-0093328 | A | 8/2013 |
| KR | 10-2014-0049666 | A | 4/2014 |
| KR | 10-2014-0085979 | A | 7/2014 |
| KR | 10-2014-0122132 | A | 10/2014 |
| KR | 10-2015-0003466 | A | 1/2015 |
| KR | 10-2015-0038826 | A | 4/2015 |
| WO | 2014-203711 | A1 | 12/2014 |
| WO | 2015-097593 | A1 | 7/2015 |

* cited by examiner

ORGANIC LIGHT EMITTING DISPLAY APPARATUS HAVING A METAL MIRROR PATTERN AND A CAMERA

This application is a continuation application of U.S. patent application Ser. No. 15/440,868 filed on Feb. 23, 2017, which claims priority under 35 USC § 119 to Korean Patent Application No. 10-2016-0026625, filed on Mar. 4, 2016, in the Korean Intellectual Property Office, the disclosures of which are incorporated herein in their entirety by reference.

BACKGROUND

1. Field

Exemplary embodiments of the inventive concept relate to an organic light emitting display apparatus. More particularly, exemplary embodiments of the inventive concept relate to an organic light emitting display apparatus having mirror function and display function.

2. Description of the Related Art

A display device displays an image using a pixel emitting light. An organic light emitting display device includes pixels having organic light emitting diodes (OLED). The OLED emits light whose wavelength depends on an organic material included in the OLED. For example, the OLED includes the organic material corresponding to one of a red color light, a green color light, and a blue color light. The organic light emitting display device displays the image by mixing the light emitted by the organic materials.

Recently, demand for a display apparatus having mirror function and display function has been increased, due to the broader range of use of displays. In addition, a display apparatus having a camera which is located on a boundary of the display apparatus (for example, a bezel of the display apparatus) has been developed. In this case, the camera cannot take an accurate front-view picture image of an object which is located in front of the display apparatus. Thus, the picture image taken by the camera may be unnatural.

SUMMARY

One or more exemplary embodiment of the inventive concept provides a display apparatus having mirror function and display function, and capable of taking a front-view picture image of an object which is located in front of the display apparatus.

According to an exemplary embodiment of the inventive concept, an organic light emitting display apparatus includes first through eighth pixels arranged in a 4*2 matrix configuration along a first and a second direction, and includes a camera which is positioned to take a picture. Each of the first through eighth pixels has a width in the first direction and has a length in the second direction. Each of the first to eighth pixels has a light emitting structure and a first mirror pattern which defines an opening that is aligned with the light emitting structure. The first mirror pattern defines one transmission window in every two or more pixels adjacent each other, wherein the transmission window transmits light, and the camera is positioned to take a picture through the transmission window.

In an exemplary embodiment, a distance between the transmission window and an adjacent transmission window may be larger than the width and the length.

In an exemplary embodiment, the 4*2 matrix is comprised of a plurality of 2*2 matrices each comprised of four pixels, and one transmission windows may be formed in each 2*2 matrix.

In an exemplary embodiment, the transmission window may be formed in the first pixel and the fourth pixel, respectively.

In an exemplary embodiment, the transmission window may be formed in the first pixel and the seventh pixel, respectively.

In an exemplary embodiment, one transmission window may be formed in every two or more pixels adjacent each other.

In an exemplary embodiment, the transmission window may be formed in the first, third sixth and the eighth pixels, respectively.

In an exemplary embodiment, the transmission window may be an opening formed at the first mirror pattern.

In an exemplary embodiment, the organic light emitting display apparatus may further include a second mirror layer disposed to overlap the first mirror pattern and the opening of the first mirror pattern.

In an exemplary embodiment, the camera may be disposed coincident with a center of the transmission window.

In an exemplary embodiment, the transmission window may have a square shape.

In an exemplary embodiment, each of the edge of the square shape of the transmission window may be rounded.

In an exemplary embodiment, a radius of the rounded edge of the transmission window may be same as or greater than a length of straight line of a side of transmission window.

In an exemplary embodiment, the transmission window may have a circle shape.

According to an exemplary embodiment of the inventive concept, an organic light emitting display apparatus includes a base substrate, a light emitting structure disposed on an upper surface of the base substrate, a sealing substrate which faces the base substrate, a first mirror pattern which is disposed on the sealing substrate, defines an opening which overlaps the light emitting structure, and defines a transmission window which transmits light therethough, and a camera positioned to take a picture through the transmission window, and is disposed on a lower surface of the base substrate. The transmission window has a shape with a rounded edge.

In an exemplary embodiment, the transmission window may have a square shape with rounded edges.

In an exemplary embodiment, a radius of the rounded edge of the transmission window may be same as or greater than a length of straight line of a side of transmission window.

In an exemplary embodiment, one transmission window may be formed in every two or more pixels adjacent each other.

In an exemplary embodiment, one transmission windows may be formed for every four pixels in 2*2 matrix.

In an exemplary embodiment, the transmission window may have a circle shape.

According to the example embodiments of the present invention, an organic light emitting display apparatus includes a first mirror pattern which has a transmission window and a camera. The mirror pattern may define one transmission window in every two or more pixels adjacent each other, so that distance between the two adjacent transmission window is larger than that of a device with a transmission window in every pixel. Thus, deterioration of a picture taken by the camera due to a diffraction may be decreased.

In addition, the transmission window may have a shape with rounded edges, so that deterioration of a picture taken by the camera due to a diffraction may be decreased.

BRIEF DESCRIPTION OF THE DRAWINGS

The above and other features of the inventive concept will become more apparent by describing in detail exemplary embodiments thereof with reference to the accompanying drawings, in which.

DETAILED DESCRIPTION

Hereinafter, the inventive concept will be explained in detail with reference to the accompanying drawings.

Figure 1:
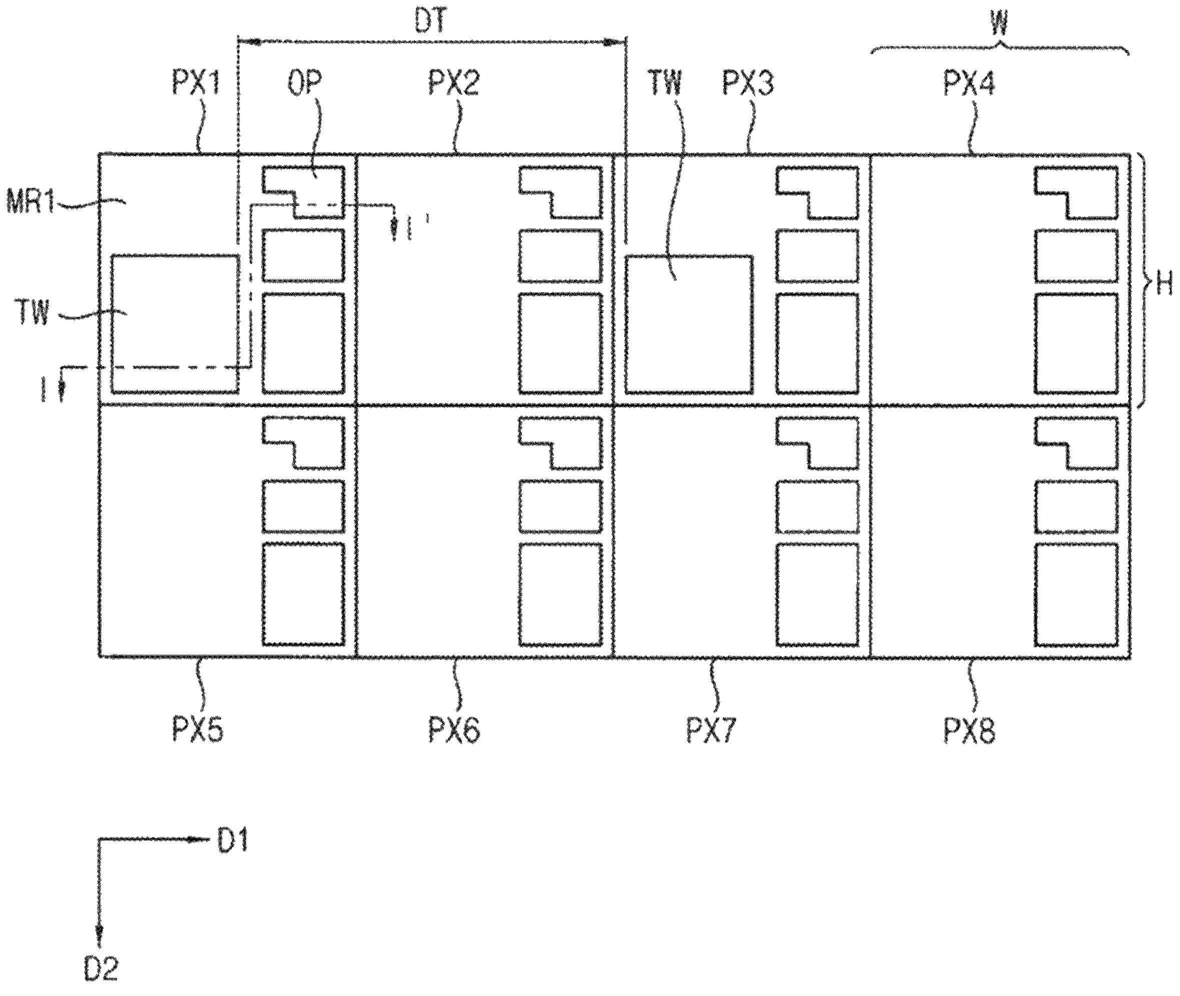
FIG. 1 is a plan view illustrating at least some of the pixels of an organic light emitting display apparatus according to an exemplary embodiment of the inventive concept.
Figure 2:
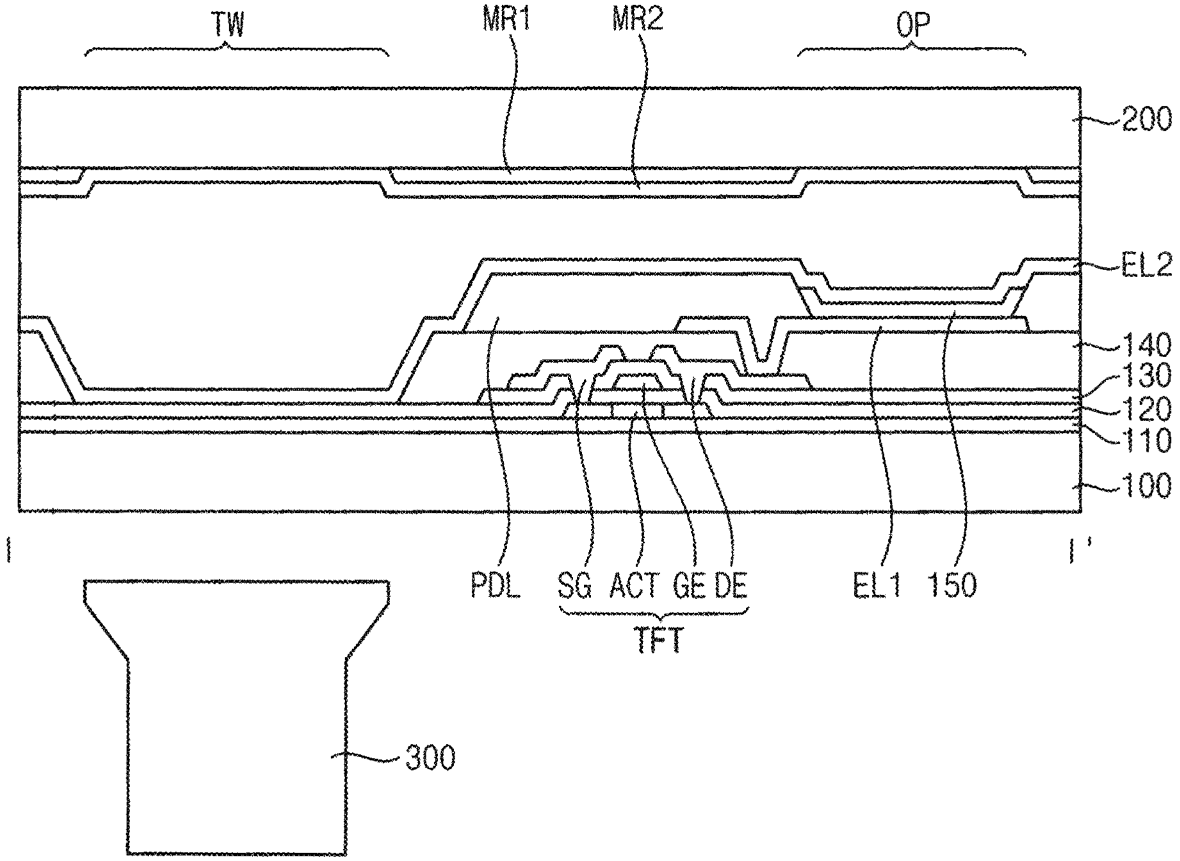
FIG. 2 is a cross-sectional view taken along a line I-I' of FIG. 1.

FIG. 1 is a plan view illustrating at least some of the pixels of an organic light emitting display apparatus according to an exemplary embodiment of the inventive concept. FIG. 2 is a cross-sectional view taken along a line I-I' of FIG. 1.

Referring to FIG. 1, the organic light emitting display apparatus includes first to eighth pixels PX1, PX2, PX3, PX4, PX5, PX6, PX7, and PX8 which are arranged in a matrix configuration along a first direction D1 and a second direction D2 which crosses the first direction D1. The second direction D2 may be substantially perpendicular to the first direction D1. The first to fourth pixels PX1, PX2, PX3 and PX4 may be arranged in the first direction D1. The fifth pixel PX5 may be disposed adjacent to the first pixel PX1 in the second direction D2. The sixth pixel PX6 may be disposed adjacent to the second pixel PX2 in the second direction D2. The seventh pixel PX7 may be disposed adjacent to the third pixel PX3 in the second direction D2. The eighth pixel PX8 may be disposed adjacent to the fourth pixel PX4 in the second direction D2. Each of the pixel may have a width W in the first direction D1 and a height H in the second direction D2.

The organic light emitting display apparatus may include a first mirror pattern MR1. The first mirror pattern MR1 may define a transmission window TW which transmits light and an opening OP that is aligned with a light emitting structure 150. As used herein, two parts being "aligned with" each other means they are at least partially lined up such that an imaginary line substantially orthogonal to the surface of the base substrate 100 passes through both parts.

The transmission window TW may be an opening formed at the first mirror pattern MR1, and may have a square shape. The transmission window TW may be formed in every four pixels. The size of the transmission window TW may be four times larger than that of a device that has a transmission window in every pixel. According to the present example embodiment, the transmission window TW may be formed in the first pixel PX1 and in the third pixel PX3, respectively.

A distance DT between two adjacent transmission windows TW is larger than the width W of the pixel, and larger than the height H of the pixel. Thus, the distance DT between the two adjacent transmission windows TW in the first direction D1 is larger than the width W, and a distance between two adjacent transmission window in the second direction D2 is larger than the height H.

In the present example embodiment, the distance between the two adjacent transmission windows TW is larger than the width W and the height H, so that distance between the two adjacent transmission window is larger than that of the prior art. Thus, deterioration of a picture taken by a camera 300 due to a diffraction may be decreased.

Referring to FIG. 2, the organic light emitting display apparatus may include a base substrate 100, a buffer layer 110, an active pattern ACT, a first insulation layer 120, a gate pattern, a second insulation layer 130, a data pattern, a planarization layer 140, a first electrode EL1, a pixel defining layer PDL, a light emitting structure 150, a second electrode EL2, a sealing substrate 200, a first mirror pattern MR1, a second mirror pattern MR2 and the camera 300.

The base substrate 100 may include a transparent insulation substrate. For example, the base substrate 100 may include a glass substrate, a quartz substrate, a transparent resin substrate, etc. Examples of the transparent resin substrate for the base substrate 100 may include polyimide-based resin, acryl-based resin, polyacrylate-based resin, polycarbonate-based resin, polyether-based resin, sulfonic acid containing resin, polyethyleneterephthalate-based resin, etc.

The buffer layer 110 may be disposed on the base substrate 100. The buffer layer 110 may prevent diffusion of metal atoms and/or impurities from the base substrate 100. Additionally, the buffer layer 110 may adjust heat transfer rate of a successive crystallization process for the active pattern ACT, to thereby obtaining a substantially uniform the active pattern ACT. In the case that the base substrate 100 may have a relatively irregular surface, the buffer layer 110 may improve flatness of the surface of the base substrate 100. The buffer layer 110 may be formed using a silicon compound. For example, the buffer layer 110 may include silicon oxide (SiOx), silicon nitride (SiNx), silicon oxynitride (SiOxNy), silicon oxycarbide (SiOxCy), silicon carbon nitride (SiCxNy), etc. These may be used alone or in a mixture thereof. The buffer layer 110 may have a single layer structure or a multi layer structure. For example, the buffer layer 110 may have a single-layered structure including a silicon oxide film, a silicon nitride film, a silicon oxynitride film, a silicon oxycarbide film or a silicon carbon nitride film. Alternatively, the buffer layer 110 may have a multi-layered structure including at least two of a silicon oxide film, a silicon nitride film, a silicon oxynitride film, a silicon oxycarbide film, a silicon carbon nitride film, etc.

The active pattern ACT may be disposed on the buffer layer 110. The active pattern ACT may include a source and a drain area which are impurity-doped areas, and a channel area between the source area and the drain area.

The first insulation layer 120 may be disposed on the base substrate 100 on which the active pattern ACT is disposed. The first insulation layer 120 may include a silicon compound, metal oxide, etc. For example, the first insulation layer 120 may be formed using silicon oxide (SiOx), silicon nitride (SiNx), silicon oxynitride (SiOxNy), aluminum oxide (AlOx), tantalum oxide (TaOx), hafnium oxide (HfOx), zirconium oxide (ZrOx), titanium oxide (TiOx), etc. These may be used alone or in a combination thereof. In addition, the first insulation layer 120 may have a single layer structure or a multi layer structure including the silicon oxide and/or the silicon nitride. In example embodiments, the first insulation layer 120 may be uniformly formed on the base substrate 100 along a profile of the active pattern ACT. Here, the first insulation layer 120 may have a substantially small thickness, such that a stepped portion may be formed at a portion of the first insulation layer 120 adjacent to the active pattern ACT. In some example embodiments, the first insulation layer 120 may have a relatively large thickness for sufficiently covering the active patterns ACT, so that the first insulation layer 120 may have a substantially level surface.

The gate pattern may be disposed on the first insulation layer 120. The gate pattern may include metal, alloy, conductive metal oxide, a transparent conductive material, etc. The gate pattern may include a gate electrode GE overlapped with the active pattern ACT, a signal line such as a gate line configured to transmit signals to drive the pixels, and etc.

The second insulation layer 130 may be disposed on the first insulation layer 120 on which the gate pattern is disposed. The second insulation layer 130 may insulate the gate electrode GE from a source electrode SE and a drain electrodes DE. The second insulation layer 130 may be uniformly formed on the first insulation layer 120 along a profile of the gate pattern. Here, the second insulation layer 130 may have a substantially small thickness, such that a stepped portion may be formed at a portion of the second insulation layer 130 adjacent to the gate pattern. The second insulation layer 130 may include a silicon compound, etc. For example, the second insulation layer 130 may be formed using silicon oxide (SiOx), silicon nitride (SiNx), silicon oxynitride (SiOxNy), etc. In some example embodiments, the second insulation layer 130 may have a relatively large thickness for sufficiently covering the gate pattern, so that the second insulation layer 130 may have a substantially level surface.

The second insulation layer 130 may not be formed at the transmission window TW of the first mirror pattern MR1. Thus, second insulation layer 130 may be formed to not overlap the transmission window TW. In some example embodiments, the second insulation layer 130 may be formed on the entire base substrate 100 to overlap the transmission window TW of the first mirror pattern MR1.

The data pattern may be disposed on the second insulation layer 130. The data pattern may include the source electrode SE, the drain electrode DE, a signal line such as a data line configured to transmit signals to drive the pixels, a second storage electrode and etc. The source electrode SE and the drain electrodes DE may be electrically connected to the active pattern ACT through contact holes formed through the first and second insulation layers 120 and 130.

The active pattern ACT, the gate electrode GE, the source electrode SE and the drain electrode DE may be included in the thin film transistor TFT.

The planarization layer 140 may be disposed on the second insulation layer 130 on which the thin film transistor TFT is disposed. The planarization layer 140 may have a single-layered structure or a multi-layered structure including at least two insulation films. The planarization layer 140 may be formed using an organic material. For example, the planarization layer 140 may include photoresist, acryl-based resin, polyimide-based resin, polyamide-based resin, siloxane-based resin, etc. These may be used alone or in a combination thereof. Alternatively, the planarization layer 140 may include an inorganic material. For example, the planarization layer 140 may be formed using silicon oxide, silicon nitride, silicon oxynitride, silicon oxycarbide, aluminum, magnesium, zinc, hafnium, zirconium, titanium, tantalum, aluminum oxide, titanium oxide, tantalum oxide, magnesium oxide, zinc oxide, hafnium oxide, zirconium oxide, titanium oxide, etc. These may be used alone or in a mixture.

The planarization layer 140 may not be formed at transmission window TW of the first mirror pattern MR1. Thus, planarization layer 140 may be formed to not overlap the transmission window TW. In some example embodiments, the planarization layer 140 may be formed on the entire base substrate 100 to overlap the transmission window TW of the first mirror pattern MR1.

The first electrode EL1 may be disposed on the planarization layer 140. The first electrode EL1 may be connected to the drain electrode DE through a contact hole which is formed through the planarization layer 140.

In some example embodiments, a contact, a plug or a pad may be formed in the contact hole, and then the first electrode EL1 may be formed on the contact, the plug or the pad. Here, the first electrode EL1 may be electrically connected to the drain electrode DE through the contact, the plug or the pad.

The organic light emitting display apparatus may be a front-emission type organic light emitting display apparatus, so that the first electrode EL1 may include a reflective material. For example, the first electrode EL1 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the first electrode EL1 may have a single layer structure or a multi layer structure.

The pixel defining layer PDL may be disposed on the planarization layer 140 on which the first electrode EL1 is formed. The pixel defining layer PDL may define an opening to expose a portion of the first electrode ELL The pixel defining layer PDL may include a transparent organic material or a transparent inorganic material. For example, the pixel defining layer PDL may be formed using photoresist, acryl-based resin, polyacryl-based resin, polyimide-based resin, a silicon compound, etc.

The light emitting structure 150 may be disposed on the first electrode EL1 which is exposed though the opening of the pixel defining layer PDL. The light emitting structure 150 may extend on a sidewall of the opening of the pixel defining layer PDL. The light emitting structure 150 may include an organic light emitting layer (EL), a hole injection layer (HIL), a hole transfer layer (HTL), an electron transfer layer (ETL), an electron injection layer (EIL), etc. In example embodiments, a plurality of organic light emitting layers may be formed using light emitting materials for generating different colors of light such as red light, green light, and blue light in accordance with color pixels of the display device (referring to three openings OP in one pixel of FIG. 1). In some example embodiments, the organic light emitting layer of the of the light emitting structure 150 may include a plurality of stacked light emitting materials for generating red light, green light, and blue light to thereby emit white light. In some example embodiment, the EL of the light emitting structure 150 may be disposed corresponding to each of pixels, and the HIL, the HTL, the ETL, the EIL, etc. may be commonly disposed corresponding to a plurality of pixels.

The second electrode EL2 may be disposed on the pixel defining layer PDL, the light emitting structure 150, the planarization layer 140 and the first insulation layer 120. The organic light emitting display apparatus may be a front-emission type organic light emitting display apparatus, so that the second electrode EL2 may include a transmissive material. For example, the second electrode EL2 may be formed using aluminum, alloy containing aluminum, aluminum nitride, silver, alloy containing silver, tungsten, tungsten nitride, copper, alloy containing copper, nickel, alloy containing nickel, chrome, chrome nitride, molybdenum, alloy containing molybdenum, titanium, titanium nitride, platinum, tantalum, tantalum nitride, neodymium, scandium, strontium ruthenium oxide, zinc oxide, indium tin oxide, tin oxide, indium oxide, gallium oxide, indium zinc oxide, etc. These may be used alone or in a combination thereof. In example embodiments, the second electrode EL2 may also have a single layer structure or a multi layer structure, which may include a metal film, an alloy film, a metal nitride film, a conductive metal oxide film and/or a transparent conductive film.

The sealing substrate 200 may be disposed on the second electrode EL2. The sealing substrate 200 may include transparent material and be configured to prevent ambient air and moisture from permeating into the transparent organic light emitting display apparatus. The sealing substrate 200 may be combined with the base substrate 100 to seal space between the base substrate 100 and the sealing substrate 200 by a sealing agent (not shown).

The first mirror pattern MR1 may be disposed on the sealing substrate 200. The first mirror pattern MR1 may form an opening OP corresponding to the light emitting structure 150. The first mirror pattern MR1 may include a material having high reflectivity, such as metal, to reflect external light. For example, the first mirror pattern MR1 may include aluminum (Al), chrome (Cr), silver (Ag), iron (Fe), platinum (Pt), mercury (Hg), nickel (Ni), tungsten (W), vanadium (V), molybdenum (Mo), etc. In some example embodiments, the first mirror pattern MR1 may have a multi layer structure having a transparent conductive metal oxide layer and a metal layer. For example, the first mirror pattern MR1 may include ITO/Ag/ITO triple layers.

The first mirror pattern MR1 may define a transmission window TW which passes light. The transmission window TW may be an opening formed at the first mirror pattern MR1.

The second mirror pattern MR2 may be disposed on the sealing substrate 200 on which the first mirror pattern MR1 is disposed. The second mirror pattern MR2 may be formed corresponding to the first mirror pattern MR1, the opening OP and the transmission window TW, so that that the second mirror pattern MR2 may be formed on the entire sealing substrate 200. The second mirror pattern MR2 may include a material same as the first mirror pattern MR1, or may include another material. Thickness of the second mirror pattern MR2 may be smaller than that of the first mirror pattern MR1. External light may be partially reflected on the opening OP and the transmission window TW of the second mirror pattern MR2 and partially transmitted through the opening OP and the transmission window TW. For example, the second mirror pattern MR2 may include aluminum (Al), chrome (Cr), silver (Ag), iron (Fe), platinum (Pt), mercury (Hg), nickel (Ni), tungsten (W), vanadium (V), molybdenum (Mo), etc. In some example embodiments, the second mirror pattern MR2 may have a multi layer structure having a transparent conductive metal oxide layer and a metal layer. For example, the second mirror pattern MR2 may include ITO/Ag/ITO triple layers. The second mirror pattern MR2 covers boundaries of the first mirror pattern MR1, so that blurring effect caused on the boundaries of the first mirror pattern MR1 due to scattered reflection.

The camera 300 may be disposed on a lower surface of the base substrate 100. The camera 300 may take a picture of an object disposed in front of the organic light emitting display apparatus through the transmission window TW. A lens of the camera 300 may be disposed corresponding to one transmission window TW. In some example embodiments, when the lens of the camera 300 is larger than one transmission window TW, a center of the lens may be disposed coincident with a center of the transmission window TW. Thus, the camera 300 may take a picture of an object disposed in front of the organic light emitting display apparatus through a plurality of the transmission window TW. In addition, in some example embodiments, the second electrode EL2 may have an opening corresponding to the transmission window TW. In addition, in some example embodiments, the second insulation layer 130 and/or the pixel defining layer PDL may be further formed corresponding to the transmission window TW. Thus, the second insulation layer 130 and/or the pixel defining layer PDL may be overlapped with the transmission window TW.

Figure 3:
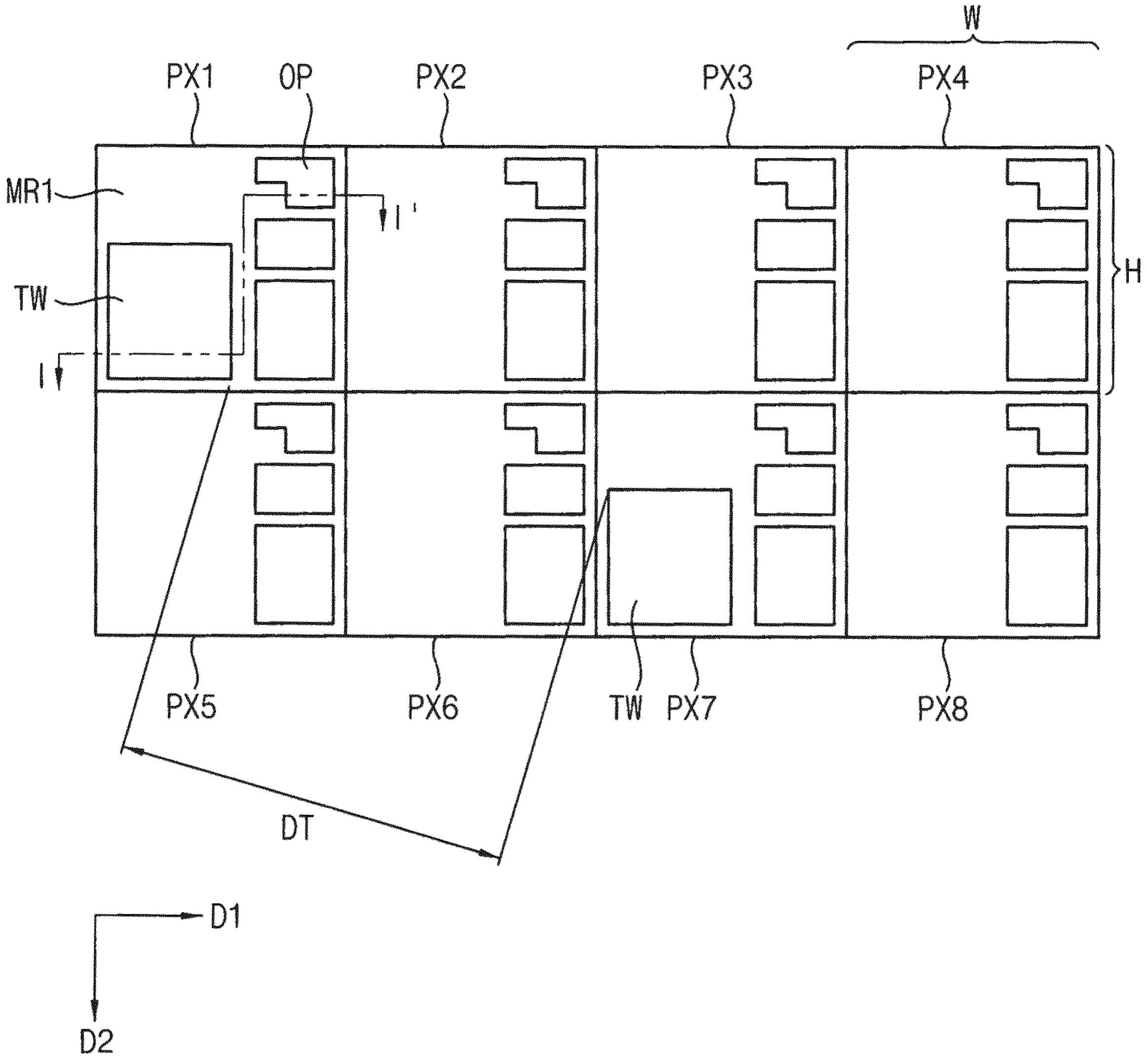
FIG. 3 is a plan view illustrating at least some of the pixels of an organic light emitting display apparatus according to an exemplary embodiment of the inventive concept.

FIG. 3 is a plan view illustrating some of pixels of an organic light emitting display apparatus according to an exemplary embodiment of the inventive concept.

Referring to FIG. 3, the organic light emitting display apparatus may be substantially the same as the organic light emitting display apparatus of FIGS. 1 and 2 except for a position of the transmission window TW. Thus, any further detailed descriptions concerning the same elements will be briefly described or omitted.

The organic light emitting display apparatus includes first to eighth pixels PX1, PX2, PX3, PX4, PX5, PX6, PX7, and PX8 which are arranged in a matrix form along a first direction D1 and a second direction D2 which crosses the first direction D1. The second direction D2 may be substantially perpendicular to the first direction D1. The first to fourth pixels PX1, PX2, PX3 and PX4 may be arranged in the first direction D1. The fifth to eighth pixels PX5, PX6, PX7 and PX8 may be arranged in the first direction D1, and may be disposed adjacent to the first to fourth pixels PX1, PX2, PX3 and PX4, respectively.

The organic light emitting display apparatus may include a first mirror pattern MR1. The first mirror pattern MR1 may define a transmission window TW which passes light and an opening OP which overlaps a light emitting structure.

The transmission window TW may be an opening formed at the first mirror pattern MR1, and may have a square shape. The transmission window TW may be formed in every four pixels, so that the size of the transmission window TW may be four times larger than that of the prior art, which has a transmission window in every pixel. According to the present example embodiment, the transmission window TW may be formed in the first pixel PX1 and in the seventh pixel PX7, respectively.

The transmission window TW of the first pixel PX1 and the transmission window TW of the seventh pixel PX7 which may be disposed diagonally adjacent to each other may be spaced apart from each other by a distance DT along an inclined direction with respect to the first direction D1. The distance DT between two transmission windows which are adjacent to each other may be larger than that of the example embodiment of FIGS. 1 and 2.

In the present example embodiment, the distance DT between the transmission windows TW may be maximized, so that the distance between the two adjacent transmission window is larger than that of the prior art. The distance DT is longer than a width W and a height H. Thus, deterioration of a picture taken by the camera 300 due to a diffraction may be decreased.

Figure 4:
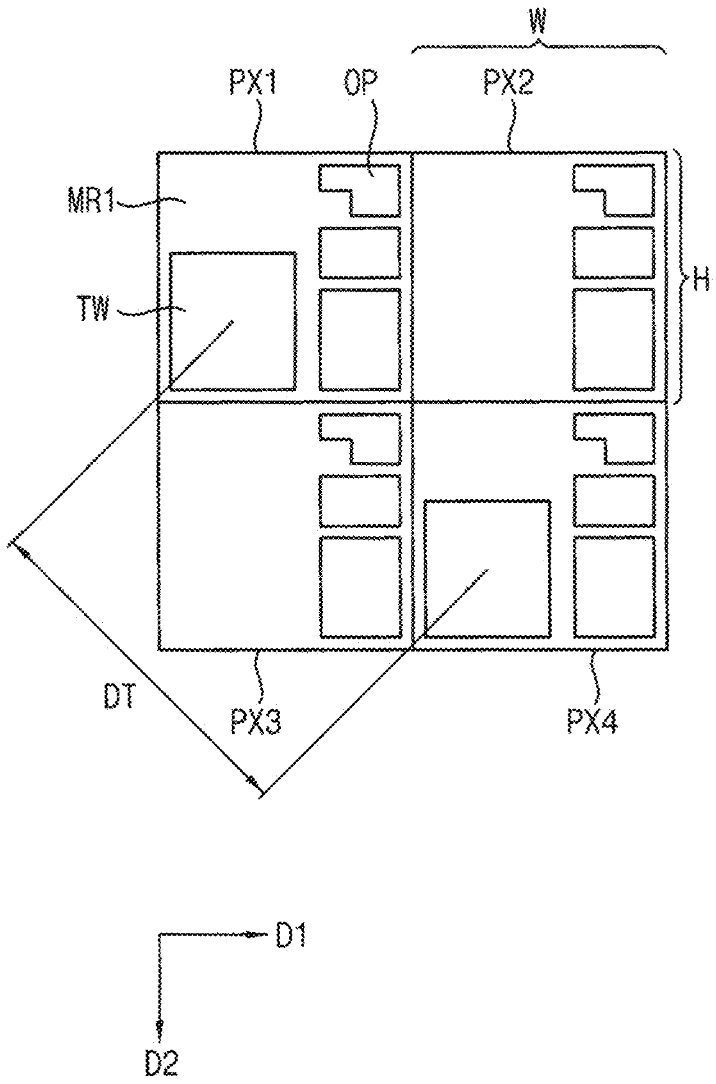
FIG. 4 is a plan view illustrating at least some of the pixels of an organic light emitting display apparatus according to an exemplary embodiment of the inventive concept.

FIG. 4 is a plan view illustrating at least some of the pixels of an organic light emitting display apparatus according to an exemplary embodiment of the inventive concept.

Referring to FIG. 4, the organic light emitting display apparatus may be substantially the same as the organic light emitting display apparatus of FIGS. 1 and 2 except for a position of the transmission window TW. Thus, any further detailed descriptions concerning the same elements will be briefly described or omitted.

The organic light emitting display apparatus includes first to fourth pixels PX1, PX2, PX3 and PX4 which are arranged in a matrix form along a first direction D1 and a second direction D2 which crosses the first direction D1. The second direction D2 may be substantially perpendicular to the first direction D1. The first and second pixels PX1 and PX2 may be arranged along the first direction D1. The third and fourth pixels PX3 and PX4 may be arranged along the first direction D1, and may be disposed adjacent to the first and second pixels PX1 and PX2, respectively.

The organic light emitting display apparatus includes a first mirror pattern MR1. The first mirror pattern MR1 may define a transmission window TW which passes light and an opening OP which overlaps a light emitting structure.

The transmission window TW may be an opening formed at the first mirror pattern MR1, and may have a square shape. The transmission window TW may be formed within every two pixels, so that the size of the transmission window TW may be two times larger than that of a device that has a transmission window in every pixel. According to the present example embodiment, one transmission window TW may be formed in each of the first pixel PX1 and in the fourth pixel PX4.

A center of the transmission window TW of the first pixel PX1 and a center of the transmission window TW of the fourth pixel PX4 which are disposed adjacent to each other may be spaced apart from each other by a distance DT along a direction inclined with respect to the first direction D1.

In the present example embodiment, the distance DT between adjacent transmission windows TW may be larger than the distance between the transmission windows in a device that has a transmission window in every pixel. Thus, deterioration of a picture taken by the camera 300 due to a diffraction may be decreased.

FIGS. 5A to 10B are figures illustrating simulation images about diffraction degree according to shapes of transmission window of an organic light emitting display apparatus according to an exemplary embodiment of the inventive concept.

Referring to FIGS. 5A, 6A, 7A, 8A, 9A and 10A, various shapes of the transmission window of the first mirror pattern of the organic light emitting display apparatus according to various example embodiments are described. The transmission window may have a square shape with rounded edges. When a radius of the rounded edge is represented as a, a straight line of a side of transmission window is represented as b, specific value of the a and b for simulation at each of the figures is following table 1.

TABLE 1

Figure 5A:
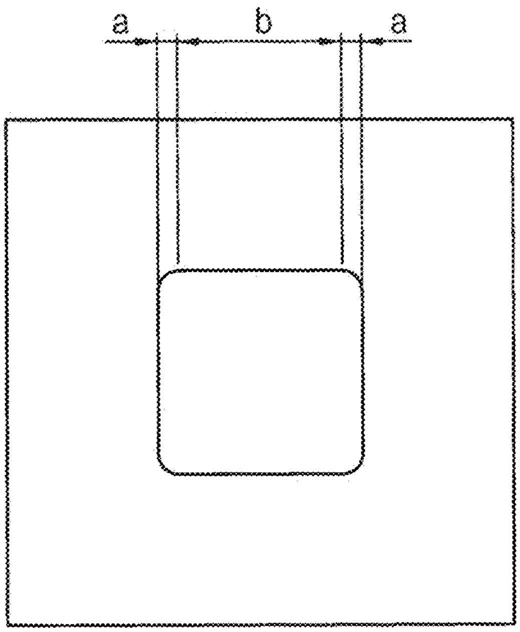
FIGS. 5A, 5B, 6A, 6B, 7A, 7B, 8A, 8B, 9A, 9B, 10A, and 10B are figures illustrating simulation images about diffraction degree according to shapes of transmission windows of an organic light emitting display apparatus according to an exemplary embodiment of the inventive concept.
Figure 5B:
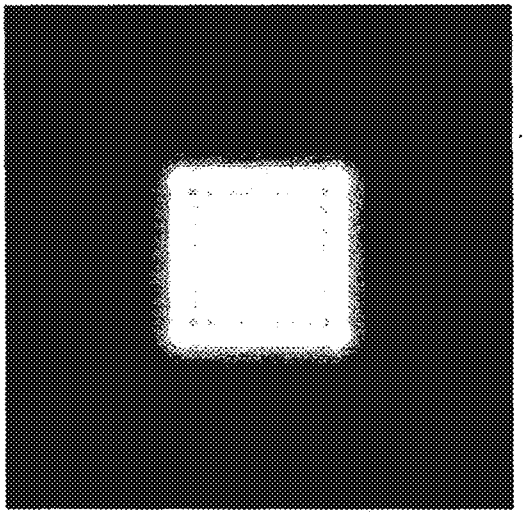
Figure 6A:
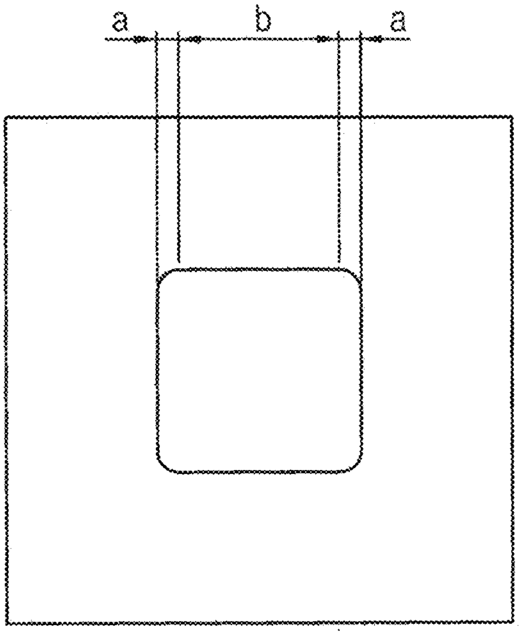
Figure 6B:
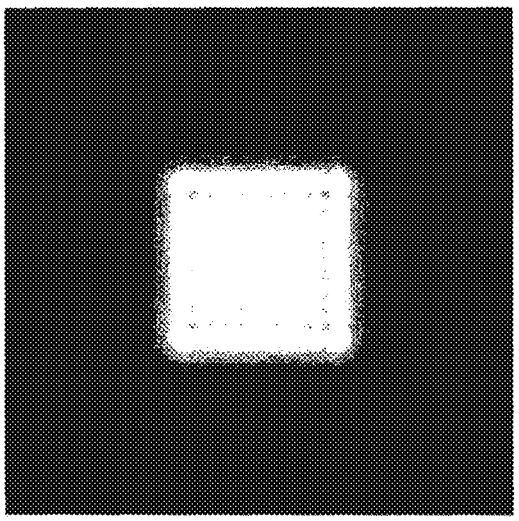
Figure 7A:
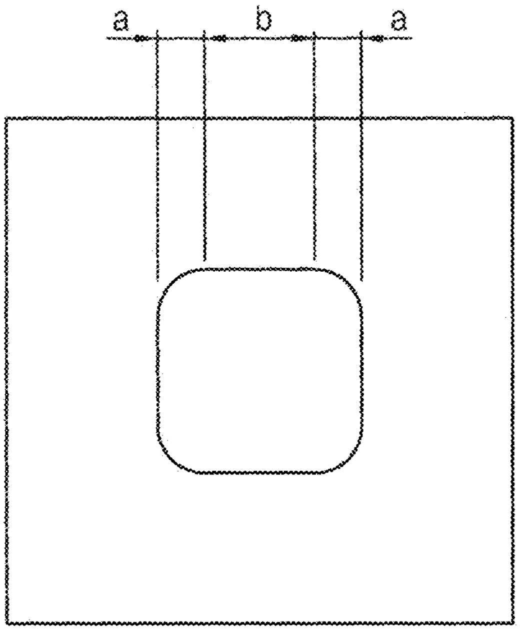
Figure 7B:
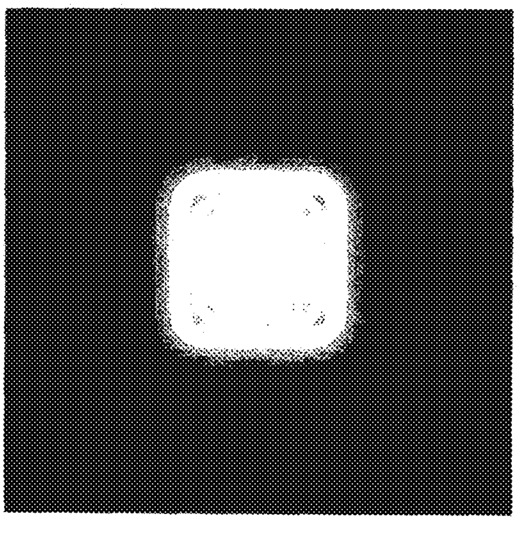
Figure 8A:
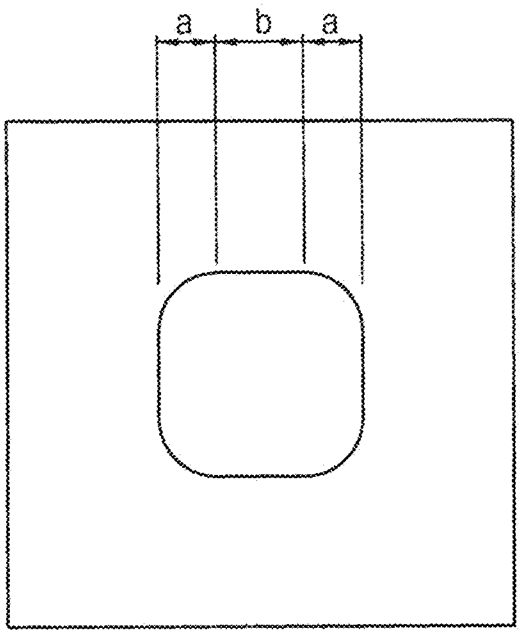
Figure 8B:
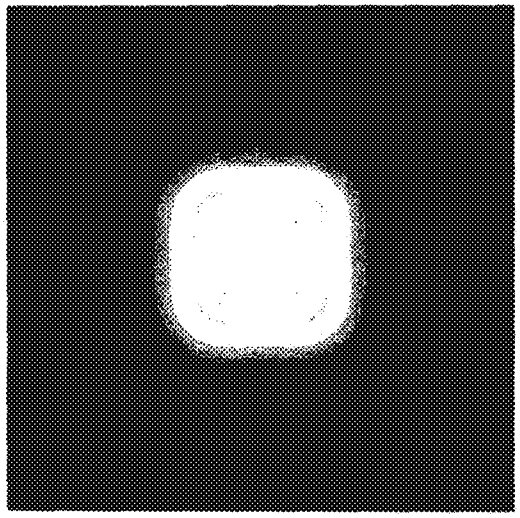
Figure 9A:
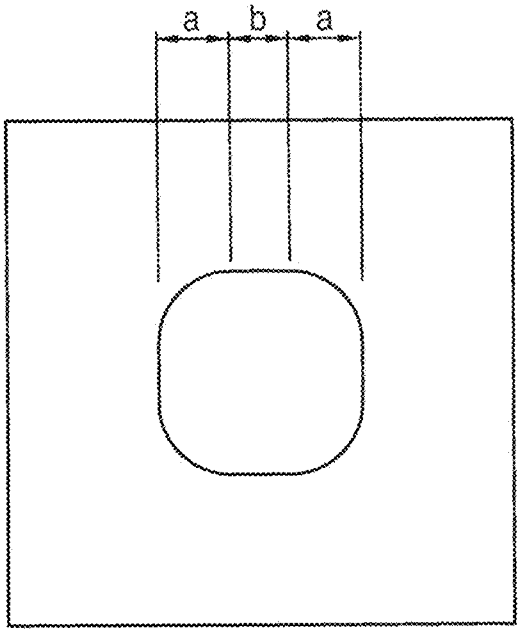
Figure 9B:
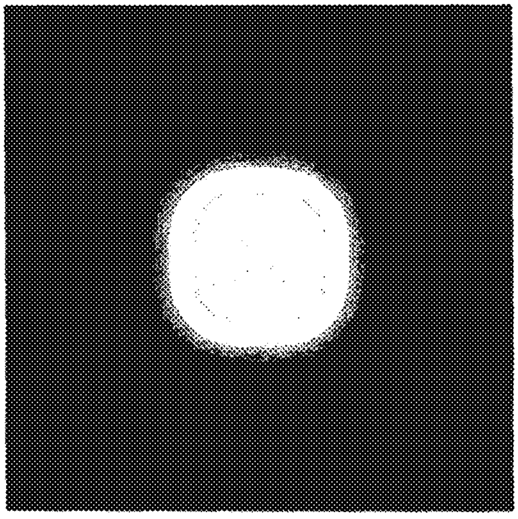
Figure 10A:
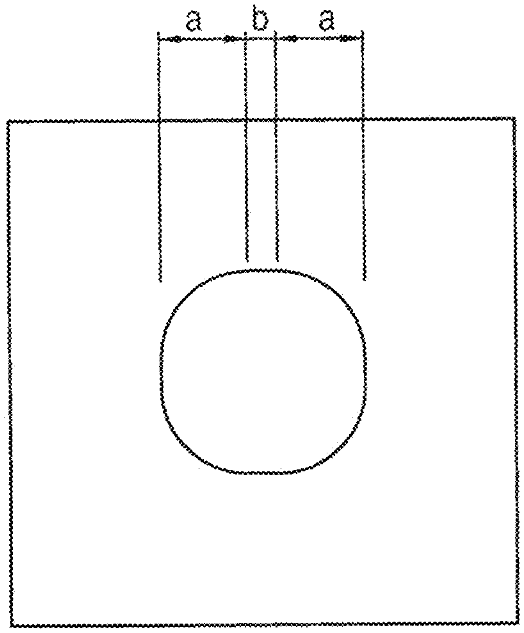
Figure 10B:
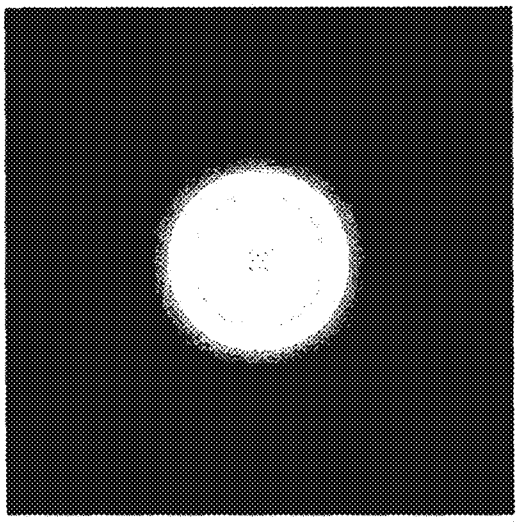

| | b (unit: μm(micrometer)) | a (unit: μm) |
|---|---|---|
| FIGS. 5A and 5B | 210 | 20 |
| FIGS. 6A and 6B | 170 | 40 |
| FIGS. 7A and 7B | 130 | 60 |
| FIGS. 8A and 8B | 90 | 80 |
| FIGS. 9A and 9B | 50 | 100 |
| FIGS. 10A and 10B | 10 | 120 |

In addition, in an example embodiment, the shape of the transmission window may be a circle.

FIGS. 5B, 6B, 7B, 8B, 9B and 10B show the effect of diffraction of light which passes the transmission window. A specific pattern may be visible at a boundary of the transmission window due to the diffraction. The specific pattern may decrease the quality of a picture which is taken by the camera (refers to 300 of FIG. 2). However, according to an example embodiment of the invention, the rounded edge may decrease the diffraction, so that the quality of the picture taken by the camera may be improved.

As the radius of the rounded edge increases, the effect of the diffraction may be decreased. In the example embodiments of FIGS. 8A, 9A and 10A, the diffraction is very small, so that the effect of the diffraction to the picture is very small. For example, when the radius of the rounded edge is same as or greater than a length of the straight line of the side of transmission window, the effect of the diffraction may be minimized.

Referring again to FIGS. 5A to 10B, the rounded edge of the transmission window reduces the diffraction of the light which passes the transmission window, so that the quality of the picture taken by the camera may be improved.

Figure 11:
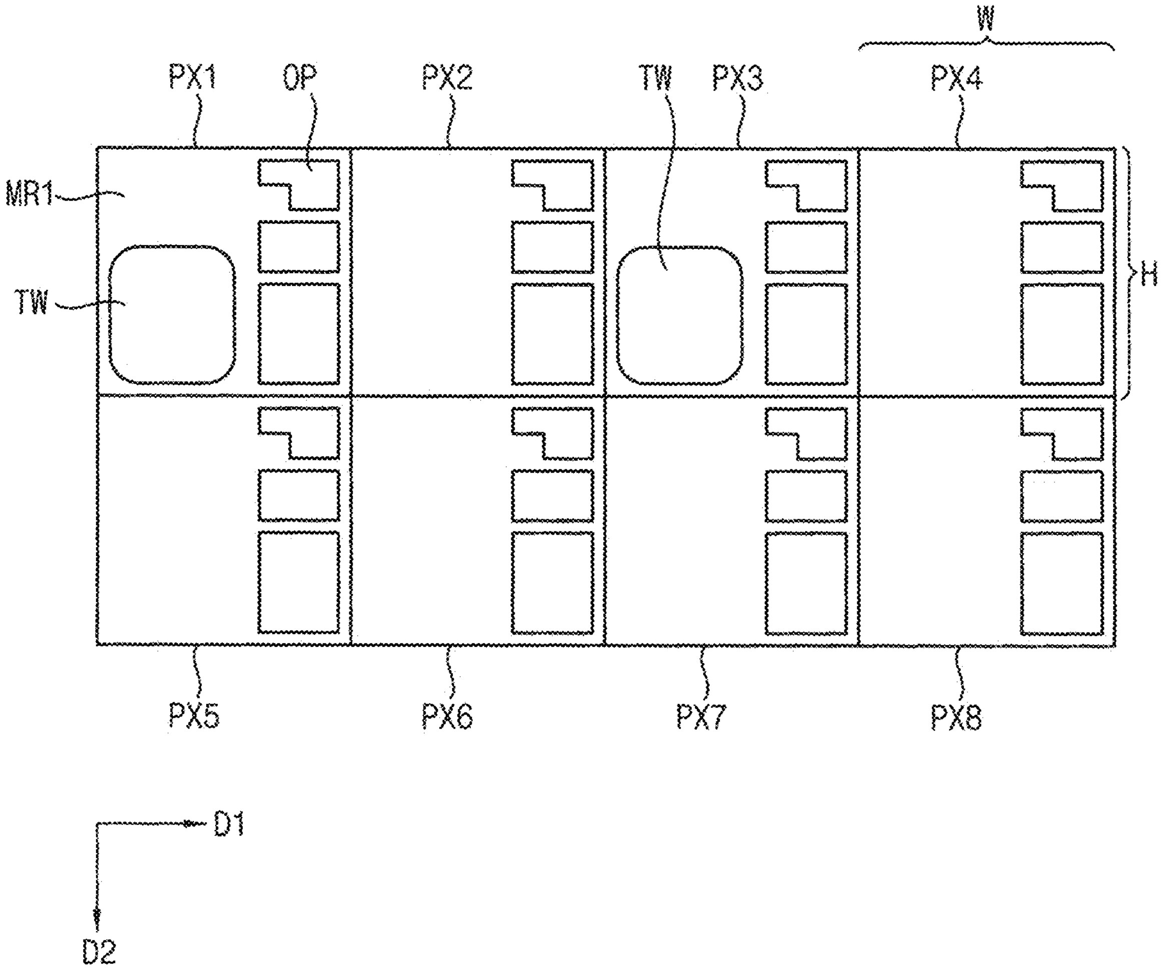
FIG. 11 is a plan view illustrating at least some of the pixels of an organic light emitting display apparatus according to an exemplary embodiment of the inventive concept.

FIG. 11 is a plan view illustrating at least some of the pixels of an organic light emitting display apparatus according to an exemplary embodiment of the inventive concept.

Referring to FIG. 11, the organic light emitting display apparatus may be substantially the same as the organic light emitting display apparatus of FIGS. 1 and 2 except for a shape of the transmission window TW. Thus, any further detailed descriptions concerning the same elements will be briefly described or omitted.

The organic light emitting display apparatus includes first to eighth pixels PX1, PX2, PX3, PX4, PX5, PX6, PX7, and PX8 which are arranged in a matrix form along a first direction D1 and a second direction D2 which crosses the first direction D1. The second direction D2 may be substantially perpendicular to the first direction D1. The first to fourth pixels PX1, PX2, PX3 and PX4 may be arranged in the first direction D1. The fifth to eighth pixels PX5, PX6, PX7 and PX8 may be arranged in the first direction D1, and may be disposed adjacent to the first to fourth pixels PX1, PX2, PX3 and PX4, respectively.

The organic light emitting display apparatus may include a first mirror pattern MR1. The first mirror pattern MR1 may define a transmission window TW which passes light and an opening OP which overlaps a light emitting structure.

The transmission window TW may be an opening formed at the first mirror pattern MR1, and may have a square shape with rounded edges. A size of the rounded edge may be properly adjusted. In an example embodiment, the shape of the transmission window TW may be a circle. The transmission window TW may be formed in every four pixels, so that the size of the transmission window TW may be four times larger than that of prior art which has a transmission window in every pixels. According to the present example embodiment, the transmission window TW may be formed in the first pixel PX1 and in the third pixel PX3, respectively.

According to an example embodiment of the present invention, an organic light emitting display apparatus includes a first mirror pattern which has a transmission window and a camera. The mirror pattern may define one transmission window in every two or more pixels adjacent each other, so that the distance between the two adjacent transmission window is larger than that of the prior art. Thus, deterioration of a picture taken by the camera due to a diffraction may be decreased.

In addition, the transmission window may have a shape with rounded edges, so that deterioration of a picture taken by the camera due to a diffraction may be decreased.

The foregoing is illustrative of the inventive concept and is not to be construed as limiting thereof. Although a few exemplary embodiments of the inventive concept have been described, those skilled in the art will readily appreciate that many modifications are possible in the exemplary embodiments without materially departing from the novel teachings and advantages of the inventive concept. Accordingly, all such modifications are intended to be included within the scope of the inventive concept as defined in the claims. In the claims, means-plus-function clauses are intended to cover the structures described herein as performing the recited function and not only structural equivalents but also equivalent structures. Therefore, it is to be understood that the foregoing is illustrative of the inventive concept and is not to be construed as limited to the specific exemplary embodiments disclosed, and that modifications to the disclosed exemplary embodiments, as well as other exemplary embodiments, are intended to be included within the scope of the appended claims. The inventive concept is defined by the following claims, with equivalents of the claims to be included therein.

What is claimed is:

1. An organic light emitting display apparatus comprising:

a base substrate;

light emitting structures disposed on an upper surface of the base substrate;

a second electrode disposed on the light emitting structures;

a sealing substrate which faces the base substrate;

a second mirror layer disposed on the sealing substrate;

first through eighth pixels disposed on the base substrate and arranged in a 4*2 matrix configuration along a first direction and a second direction; and a camera positioned under the base substrate to take a picture through a transmission window, wherein each of the first through eighth pixels has a width in the first direction and a length in the second direction, and each of the first through eighth pixels has the light emitting structures and a first mirror pattern, wherein the first mirror pattern disposed in the first pixel includes at least three openings that are aligned with the light emitting structures and one transmission window that is aligned with the camera, and includes metal to reflect external light, wherein each of the first through eighth pixels includes a thin film transistor including an active pattern, a gate electrode, a source electrode and drain electrode, and a plurality of insulation layers including a first insulation layer which insulates the active pattern from the gate electrode, a second insulation layer which insulates the gate electrode from the source electrode and the drain electrode, and a third insulation layer which is disposed on the source electrode and the drain electrode, wherein the second insulation layer and the third insulation layer do not overlap the transmission window in a third direction perpendicular to the first and second directions, wherein the first insulation layer, which insulates the active pattern from the gate electrode, overlaps the transmission window in the third direction, and a portion of an upper surface of the first insulation layer directly contacts the second electrode in the transmission window, and wherein the second mirror layer overlaps the first mirror pattern, the openings of the first mirror pattern, and the transmission window which does not overlap the light emitting structures.

2. The organic light emitting display apparatus of claim 1, wherein the 4*2 matrix comprises a plurality of 2*2 matrices and wherein each of the plurality of 2*2 matrices includes four pixels, and wherein the transmission window is formed in each 2*2 matrix.

3. The organic light emitting display apparatus of claim 2, wherein the transmission window is formed in the first pixel and the fourth pixel, respectively.

4. The organic light emitting display apparatus of claim 2, wherein the transmission window is formed in the first pixel and the seventh pixel, respectively.

5. The organic light emitting display apparatus of claim 1, wherein the transmission window is formed in every two or more pixels adjacent each other.

6. The organic light emitting display apparatus of claim 1, wherein the transmission window is formed in the first pixel, third pixel, sixth pixel, and the eighth pixels, respectively.

7. The organic light emitting display apparatus of claim 1, wherein the camera is aligned with a center of the transmission window along a third direction perpendicular to the first direction and the second direction.

* * * * *